(12) United States Patent  
Dow

(10) Patent No.: US 6,737,356 B1  
(45) Date of Patent: May 18, 2004

(54) METHOD OF FABRICATING A SEMICONDUCTOR WORK OBJECT

(75) Inventor: Daniel B. Dow, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/499,594

(22) Filed: Feb. 7, 2000

(51) Int. Cl.$^7$ .............................................. H01L 21/027
(52) U.S. Cl. ........................ 438/696; 216/18; 216/46; 216/57; 134/1.3; 438/629; 438/700; 438/702; 438/704; 438/745
(58) Field of Search ................................ 438/745, 696, 438/700, 701, 702, 629, 704; 216/18, 46, 57; 134/1, 3

(56) References Cited

U.S. PATENT DOCUMENTS

| | | | | |
|---|---|---|---|---|
| 4,551,417 A | * | 11/1985 | Suzuki et al. | 216/22 |
| 5,366,929 A | * | 11/1994 | Cleeves et al. | 437/195 |
| 5,622,894 A | * | 4/1997 | Jang et al. | 438/643 |
| 5,700,726 A | * | 12/1997 | Huang et al. | 437/643 |
| 5,874,355 A | * | 2/1999 | Huang et al. | 438/627 |
| 5,933,759 A | * | 8/1999 | Nguyen et al. | 438/700 |
| 5,990,019 A | * | 11/1999 | Torek et al. | 438/723 |
| 6,284,666 B1 | * | 9/2001 | Naeem et al. | 438/713 |
| 6,380,095 B1 | * | 4/2002 | Liu et al. | 438/719 |
| 6,451,705 B1 | * | 9/2002 | Trapp et al. | 438/723 |
| 6,569,774 B1 | * | 5/2003 | Trapp | 438/706 |
| 6,630,410 B2 | * | 10/2003 | Trapp et al. | 438/423 |
| 2001/0023132 A1 | * | 9/2001 | Chen et al. | 438/706 |

OTHER PUBLICATIONS

Aoto, N. et al "Native oxides on Si surfaces of deep–submicron contact–hole bottoms" J. Appl. Phys., Apr. 5, 1995, 77 (8) 3899–3907.*

Peter Van Zant, *Microchip Fabrication: A Practical Guide to Semiconductor Processing*, 3$^{rd}$ Edition, 1997 (Chapters 5, 9 and 13, pp. 99–118; 245–283; 389–418), McGraw–Hill, USA.

INSPEC Abstract/M. Miyamoto and H. Gotoh, *Wet Chemical Cleaning for Damaged Layer Removal Inside the Deep Sub–micron Contact Hole*, Published by IEEE, New York, NY, USA,1992.

* cited by examiner

*Primary Examiner*—Anita Alanko  
(74) *Attorney, Agent, or Firm*—Ganz Law, PC; Bradley Ganz; James L. Wolfe

(57) ABSTRACT

A method of forming a conductive plug in a contact hole comprising: providing a wafer having a conductive layer comprising silicon adjacent a dielectric layer comprising silicon oxide, and a contact hole disposed in the dielectric layer, the contact hole having surfaces that include sidewalls formed in the dielectric layer and a bottom defined by the conductive layer, a contaminant material being disposed over at least a portion of the conductive layer defining the bottom of the contact hole, the dielectric layer having a surface in which the contact hole terminates in an opening opposing the bottom; depositing a layer of a barrier material on the work object, the layer having a substantially uniform thickness from the surface at the opening of the contact hole to the bottom of the contact hole; and depositing a layer of a protective material barrier around at least opening of the contact hole; etching the material at the bottom of the contact hole to expose the contaminant material while retaining protective material around the opening of the contact hole; etching the contact hole to remove contaminant material disposed over the conductive layer at the bottom of the contact hole; and filling the contact hole with a conductive material to form a plug.

62 Claims, 4 Drawing Sheets

METHOD OF FABRICATING A SEMICONDUCTOR WORK OBJECT

BACKGROUND OF THE INVENTION

The present invention relates to a method of forming conductive structures on a semiconductor work object. More particularly, it relates to cleaning etched contact holes before metal plugs or other conductive structures are formed therein.

Every semiconductor chip has electrical connections between different devices or circuit component parts on the chip. The devices and components are associated with conductive structures to provide such connections. The formation of contact plugs, vias, metal lines and other conductive structures providing connectivity on a chip will generally be referred to herein as "metallization".

In conventional processes, a contact or contact hole (or similar structure, such as a via) is etched in a layer of a dielectric material that is disposed over a layer of conductive material. Typically the dielectric material is a silicon oxide and the conductive material is a silicon substrate with dopant. The conductive material could also be another contact or via of silicon, tungsten, or polysilicon, for example. The contact is filled with a conductive material, typically a metal, to form a plug. The plug formed in the contact hole may consist of tungsten, aluminum, copper or other conductive material known in the art. An initial layer of a refractory metal such as Titanium is often first deposited on silicon at the bottom of the contact hole to form a silicide. Silicides help facilitate the electrical connection between the plug and silicon. A conductive barrier layer may also be placed between the conductive layer and the plug to control eutectic alloying, physical migration, or contamination. The barrier layer may also help anchor the plug into the contact hole. Titanium-tungsten (TiW) or titanium nitride (TiN) may be used to form a barrier layer. At the surface of the dielectric layer, the metal plug may be connected to thin lines of metal called leads, metal lines, as well as other interconnects, which connect the device associated with one conductive plug to another plug or other structure associated with a different device.

Metallization techniques are well known in the art. Certain such techniques are discussed in P. Van Zant, *Microchip Fabrication: A Practical Guide To Semiconductor Processing* ($3^{rd}$ ed. 1997) McGraw-Hill, New York, Chapters 5 & 13. Before a contact hole is filled with a conductive material to form a conductive plug, the hole is cleared of any contaminants including oxides, other resistive materials, and residuals (hereinafter such materials are referred to as "contaminant materials") that may form or remain over the conductive region at the bottom of the contact hole. After wet etching to remove the contaminant material, further processing steps will form a plug of conductive material in the etched hole. If any appreciable amount of contaminants material remains at the bottom of the contact hole, it could impede current flow through the contact components or migrate into the underlying conductive layer. Therefore, contaminants are highly problematic for at least these reasons.

Cleaning and etching agents are used to remove contaminants before filling contact holes. Cleaning the contact hole is important, for example, to facilitate the formation of acceptable suicides at the bottom of the contact hole. Wet etchants are preferred for removing the contaminant material.

With the drive toward smaller chips with higher device densities, contact-hole widths are decreasing. Concurrently, contact holes are getting longer as they are required to extend through more layers on a die to reach the base silicon, polysilicon, or other conductive media. Consequently, the decreasing contact-hole widths and/or increasing contact-hole lengths means contact holes with high aspect ratios are becoming more prevalent. This is particularly true in the manufacture of DRAM memory chips.

The formation of conductive structures in small, high aspect ratio contact holes is especially problematic. Given the tight geometry of such holes, it is difficult, for example, to control conventional wet etchants so that they do not change the critical dimensions (CDs) of the contact hole during the process of removing oxides or other residual materials from the bottom of the contact hole.

Wet etchants especially affect CDs of small, high-aspect ratio contact holes. As etchant moves down the contact hole it becomes depleted as it reacts with the oxide sidewalls of the contact hole. Therefore, the etchant's rate of reaction with oxide or other contaminant materials may be slower at the bottom of the contact hole and faster at the top of the hole. Unfortunately, because of the duration of time needed to the etch contaminant materials at the bottom of the contact hole, structural material at the top of the contact hole may be overetched during the process of removing the contaminants. This excessive etching may increase the width or diameter of the contact hole beyond specified critical dimensions.

When a contact hole exceeding critical dimensions is filled with conductive material to form a plug or other conductive structure, an oversized plug is formed. The oversized plug may be closer to adjacent or nearby conductive structures, creating a problem of electrical shorting.

To remove contaminants from small, high aspect ratio contacts, various conventional wet etchants may be used. Persons skilled in the art may choose from many available etchant technologies to remove the contaminants, including hydrofluoric (HF) in deionized (DI) water; HF/TMAH; HCL; and phosphoric and ammonia fluoride based solutions. Unfortunately, all of these solutions may adversely affect critical dimensions, as described above. Accordingly, priori art cleaning techniques are inherently problematic in their failure to preserve critical contact hole structures and dimensions.

SUMMARY OF THE INVENTION

The present invention overcomes the problems and disadvantages in the prior art by providing a process that preserves-contact hole CDs while allowing removal of contaminant contacts from the bottom of the contact hole (or other region adjacent a conductive region). Accordingly, the present invention improves production yields of dies having contact with small, high aspect ratios. Further, the present invention helps make higher density chips possible.

In one novel embodiment, the present invention provides a method of preparing a contact hole to receive a conductive plug comprising: providing a work object having a conductive layer adjacent a dielectric layer, and a contact hole disposed in the dielectric layer, the contact hole having surfaces that include sidewalls formed in the dielectric layer and a bottom defined by the conductive layer, the contact hole having an opening for receiving a conductive plug material; and depositing a layer of protective material on at least the surface around the opening of the contact hole, the material deposited being sufficient to protect the CDs of the contact hole opening during an etch of the contact hole to remove any contaminant material disposed over the conductive layer at the bottom of the contact hole.

In another novel embodiment, the present invention provides a method of forming a conductive plug in a contact hole comprising: providing a work object having a conductive layer adjacent a dielectric layer, and a contact hole disposed in the dielectric layer, the contact hole having surfaces that include sidewalls formed in the dielectric layer and a bottom defined by the conductive layer, the contact hole having an opening for receiving a conductive plug material; depositing a layer of protective material on at least the surface around the opening of the contact hole, the material deposited being sufficient to protect the CDs of the contact hole opening during etching of the contact hole to remove any contaminant material disposed over the conductive layer at the bottom of the contact hole; etching the protective material at the bottom of the contact hole to expose the contaminant material while retaining protective material around the opening of the contact hole; and filling the contact hole with a conductive material to form a plug.

In another novel embodiment, the present invention provides a method of forming a conductive plug in a contact hole comprising: providing a wafer having a conductive layer comprising silicon adjacent a dielectric layer comprising silicon oxide, and a contact hole disposed in the dielectric layer, the contact hole having surfaces that include sidewalls formed in the dielectric layer and a bottom defined by the conductive layer, a contaminant material being disposed over at least a portion of the conductive layer defining the bottom of the contact hole, the dielectric layer having a surface in which the contact hole terminates in an opening opposing the bottom; depositing a layer of a barrier material on the work object, the layer having a substantially uniform thickness from the surface at the opening of the contact hole to the bottom of the contact hole; and depositing a layer of a protective material barrier around at least the opening of the contact hole; etching the material at the bottom of the contact hole to expose the contaminant material while retaining protective material around the opening of the contact hole; etching the contact hole to remove contaminant material disposed over the conductive layer at the bottom of the contact hole; and filling the contact hole with a conductive material to form a plug.

The foregoing novel embodiments may include other advantageous features, defining further novel embodiments. Some such features are noted below and may be added to one or more of the foregoing embodiments alone or in combinations. In this regard, the embodiments of the present invention may further comprise the step of depositing a layer of barrier material over the surfaces of the contact hole before deposition of the protective material, and etching the barrier layer at the bottom of the contact hole to expose any contaminant material, while retaining protective material around the opening of the contact hole following the etch of the barrier layer. The embodiments of the present invention may use a dry etch technique to etch the barrier layer at the bottom of the contact hole and a wet etch technique to etch any contaminant material exposed following the dry etch. The embodiments of the present invention may have a barrier layer material comprising a refractory metal based compound that extends from the surface at the opening of the contact hole to the bottom of the contact hole. The embodiments of the present invention may have a layer of protective material that comprises a refractory metal based compound extending from the opening of the contact hole to a selected depth into the contact hole. The embodiments of the present invention may have a conductive layer that comprises a silicon based material and a dielectric layer that comprises a silicon oxide based material.

The embodiments of the present invention may use a PVD process to deposit the layer of protective material. The embodiments of the present invention may use a CVD process to deposit the layer of barrier material. The embodiments of the present invention may use a protective material that is composed substantially of TiN.

In the embodiments of the present invention, the contact hole may have a high aspect ratio. Further, in the embodiments of the present invention the opening of the contact hole at the surface of the dielectric layer may have a width of about 2 microns or less. The aspect ratio of the contact hole may be about 3:1 or more.

The embodiments of the present invention may include the step of depositing a layer of a metal on the conductive layer at the bottom of the contact hole. The metal is deposited subsequent to the wet etch to remove contaminants from the bottom of the contact hole. In certain embodiments, the deposited metal is a refractory metal. The refractory metal may be Ti. In the embodiments of the present invention, it is further contemplated that a barrier layer may be deposited over the metal deposited at the bottom of the contact. The barrier layer may be TiN.

In the embodiments of the present invention, conductive plug may be composed substantially of Ag, Al, Au, Cu, or W. Where tungsten is the conductive plug material, a preferred barrier layer material is TiN.

In the embodiments of the present invention, it is contemplated that the contact hole may be a via or a container for a capacitor.

The foregoing novel embodiments and features of the present invention and other novel embodiments and features of the present invention are described below in more detail. It should be understood that the description contained herein is only illustrative of the invention. Various alternatives and modifications can be devised by those skilled in the art without departing from the spirit of the invention. Accordingly, the present invention is intended to embrace all such alternatives, modifications and variances which fall within the scope of the appended claims.

DETAILED DESCRIPTION OF THE INVENTION

Figure 1:
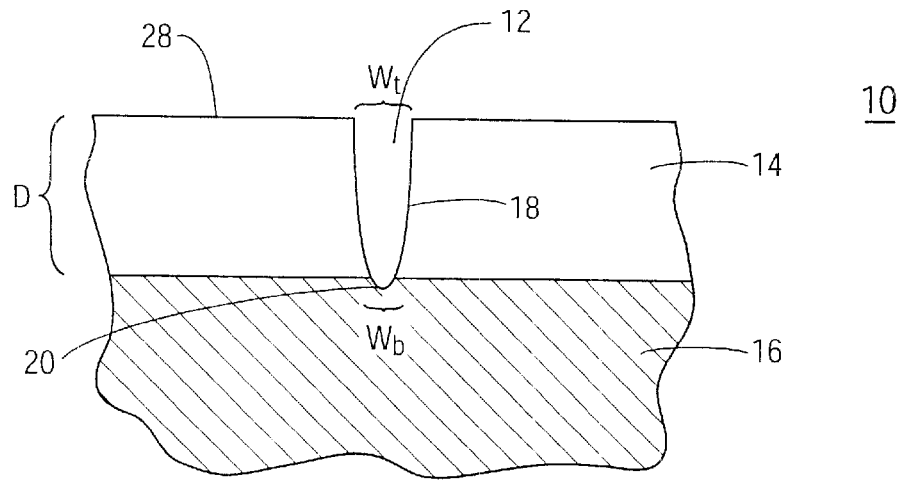
FIG. 1 is a side sectional view of a portion of a device on a wafer with a contact hole for the device etched into material on the wafer.
Figure 2:
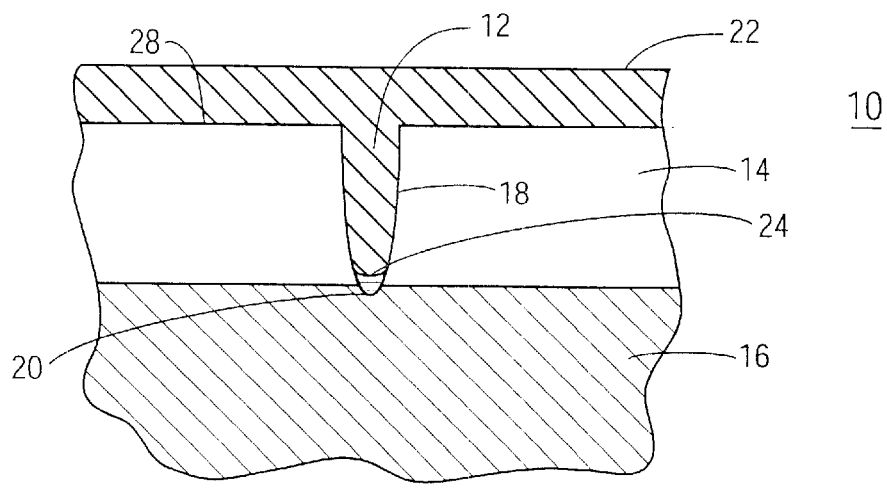
FIG. 2 is the same view of the contact hole in FIG. 1, now showing a contaminant material formed at the bottom of the contact hole, with conductive filler material shown in phantom lines.
Figure 3:
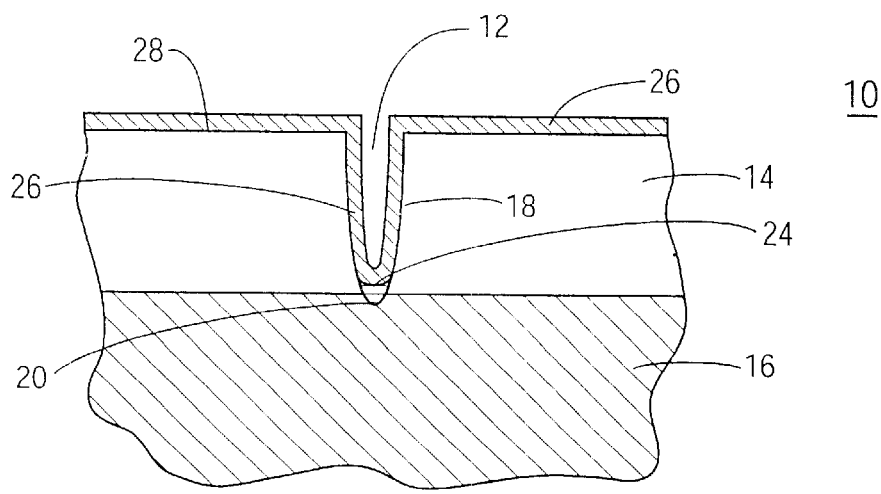
FIG. 3 is the same view of the contact hole in FIG. 2, now showing a layer of material deposited over existing material, according to the present invention.

As used herein, "work object" means wafers (production, dummy, or pmon), chip, die and packaged parts, incorporating, in whole or part, silicon substrates, and other known or discovered semiconductor materials, components, and assemblies, including, for example, silicon-on-insulator (SOI), silicon-on-sapphire (SOS), thin film transistor (TFT) materials, or germanium, periodic group III–IV materials, II–VI materials, hetero-materials (II, III, V, VI), and conductive glasses.

It will be apparent to persons of skill in the art that the present invention is not necessarily limited to any particular kind of work object. However, to illustrate the principles of the present invention, the following discussion, unless otherwise noted, will be in terms of a silicon-based wafer as the work object.

FIGS. 1–5 show a contact hole 12 for a portion of a semiconductor device 10 on a wafer. The contact hole 12 extends through a layer 14 of a dielectric material. The dielectric layer 14 may be silicon dioxide, BPSG, silicon nitride, polyimide, or other electrically insulative materials used in the art. The contact hole 12 extends to an underlying layer or region of a conductive substrate 16. Typical materials for conductive substrate 16 include doped layers or regions of silicon or polysilicon. Generally, suitable dopants include boron, phosphorus, and arsenic. In a common scenario, contact hole 12 is formed in a silicon dioxide layer 14 disposed over a silicon substrate 16. It is to be understood that contact hole 12 in device 10 would normally represent one of a plurality of such structures being formed in association with individual devices on individual dies on a wafer.

The contact hole 12 is defined by sidewalls 18 and bottom 20. As illustrated in the figures and discussed below, the width or diameter at the bottom 20 of the contact hole may be less than that at the top of the contact hole. Contact holes may be broader at the top to facilitate connections of the plug formed in the contact hole with the metal lines on the surface of the wafer; a contact hole may be narrower at the bottom where the plug connects to conductive aspects of the device having relatively small landing pads. This invention, however, may apply to other contact hole configuration and is not limited to contact holes having a wider top and narrower bottom. It could apply, for example, to a contact hole having a wider bottom and narrower top.

For purposes of the present, invention, "aspect ratio" means the ratio of the depth D or length of the contact hole to the width or diameter $W_t$ at the top of the contact hole. Generally, the critical dimension (CD) of most interest is $W_t$ at the top opening of contact hole 12. Accordingly, as used hereafter, the CD is the allowable range or tolerance for $W_t$.

A contact hole 12 with a D of about 2.0 microns and a diameter or $W_t$ of about of 0.3 microns at the top opening in the surface of dielectric layer 14 is one possible example of a small contact hole having a high aspect ratio. Due to the tapered nature of the contact hole, the width or diameter $W_b$ at the bottom of the contact hole might be about 0.17 microns, for example. A contact hole of such dimensions would have an aspect ratio of about 6.67. A contact hole with a "small, high aspect ratio" may be generally defined as a contact hole where D is about 2.0 microns or less and where $W_t$ is a number that when divided into the D yields an aspect ratio of about 3:1 or greater.

Persons skilled in the art will understand that other dimensions may define high aspect ratios, and that the aspect ratio range given above is merely an exemplary. Such persons skilled in the art will also appreciate that the principles of the present invention may be employed regardless aspect ratios, depending, on a given set of circumstances, including, for example, the particular compositions of the dielectric and semiconductor layers; the nature of the etchants used; and the conditions under which processing occurs. Accordingly, it is contemplated that this invention will be generally useful to preserve contact hole CDs during etching to remove contaminant material from contact holes and similar holes.

Figure 7:
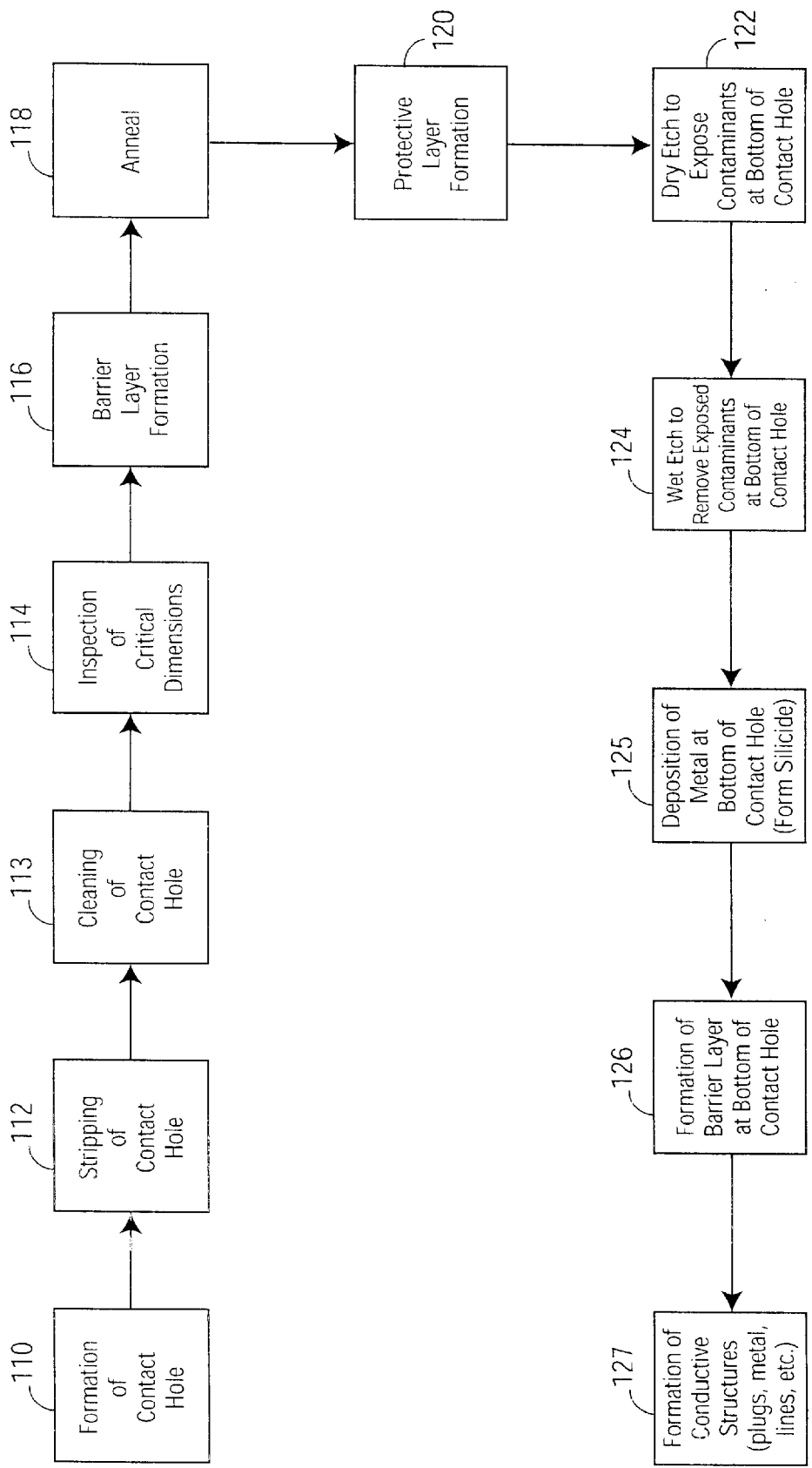
FIG. 7 shows a schema for producing a contact hole and conductive structures of FIG. 6, according to the present invention.

FIG. 7 shows one possible novel scheme according to the present invention that includes steps for forming a contact hole in a device, preparing the contact hole for plug formation, and metallizing the device.

Referring again to FIG. 2, before a plug is formed in contact 12, any appreciable amounts of contaminant material 24 should be removed from the bottom 20 of contact hole 12. If there is any appreciable amount of such contaminant material 24, it will become interposed between conductive layer 16 and conductive material 22. This may impede current flow to and from the device 10, preventing it from functioning properly. Contaminant material 24 may accrete at the bottom of a contact hole as a result of the etching process 110 that forms the contact hole. The contaminant material 24 may also be a native oxide that forms during or between process steps.

The etch process 110 used to form contact hole 12 is typically a dry etch process. However, other etch techniques that produce the desired contact hole structure may also be used. Dry etches are preferably used in forming contact holes because they act anisotropically on a substrate. Accordingly, they produce the relatively vertical sidewalls needed for contacts. Dry etch techniques are useful for etching pattern sizes of three microns or less. In contrast, conventional wet etch techniques (including immersion, spray and vapor applications) are isotropic, producing sloped sidewalls. They also are limited to pattern sizes of about three microns.

One form of dry etch, known as a "plasma etch", generally refers to an etch using reactive gases energized by a plasma field. Dry etch processes are well known in the art. For example, they are generally described in P. Van Zant, *Microchip Fabrication: A Practical Guide To Semiconductor Processing* ($3^{rd}$ ed. 1997) McGraw-Hill, New York, Chapter 9.

A stripping step 112 for stripping photoresist material from the surface of the wafer is employed following step 110. Stripping agents are well known in the art. A wet clean may optionally be employed in step 133 for removing from the wafer residual material from the dry etch or other matter. Suitable wet cleaning agents include HF-deionized water based solutions with or without TMAH; phosphoric acid ($H_3PO_4$,) and ammonium fluoride ($NH_4F$) based solutions, as well as other known etching and cleaning solutions. One example of a suitable solution contains about 40 wt. % $NH_4F$, about 1.0–1.3 wt. % phosphoric acid ($H_3PO_4$,), and deionized water as the remainder. This optional, but routinely used, cleaning step removes contaminants from the dry etch process. Also, optionally, the wafer may be inspected in step 114 to determine whether critical dimensions have been maintained through the dry etch and stripping/cleaning steps 112 and 113.

Following contact hole formation and any cleaning/stripping or inspection steps, a layer of barrier material 26 is deposited on at least those structures of the wafer whose CDs need to be protected in subsequent step 124 aimed at removing any contaminant material 24 from the contact hole 12. Barrier layer 26 generally may be any material that adheres to the structures of the wafer and, when subjected to etchants used to remove contaminant material 24 in step 124, will not be etched or will etch at a lower etch rate than the contaminant material 24.

In one preferred embodiment for forming a barrier layer 26, a wafer is subjected to a process 116 that forms a barrier layer 26 over the sidewalls 18 and bottom 20 of contact hole 12. A preferred method for doing this is using conventional chemical vapor deposition (CVD) techniques. CVD processes tend to deposit materials in a uniform thickness on all exposed surfaces. The functions of barrier layer 26 include (1) wetting conductive material 22 to the sidewalls 18 and bottom 20 of contact hole 12; (2) providing a barrier against migration; and (3) protecting the underlying oxide (or other dielectric) structure from loss of CDs during etching in subsequent step 124 to remove contaminant material at the bottom of contact hole 12. Barrier layer 26 may be any material that will adhere to dielectric layer 14 and to conductive material 22 deposited into the contact hole 12. Preferably, barrier layer 26 is deposited so as to provide about a uniform thickness along the surfaces that are covered with the deposited material.

Certain refractory metal based compounds are known to be suitable as a barrier layer. Titanium nitride (TiN) is one example of a suitable refractory metal based compound that is a suitable material for barrier layer 26. It is particularly suitable for use where conductive material 22 is composed of tungsten (W) and the dielectric layer 14 is a silicon oxide. Tungsten does not adhere well to bare oxide. Therefore, direct deposit of the tungsten onto the oxide may produce voids in the deposited material. Tungsten does adhere well to TiN. Therefore, the TiN barrier layer is used to wet the W to the bare oxide, forming a plug 32. Barrier layer 26 also protects a silicon based conductive layer 16 from attack by fluorine species that may be present in the process of metallization using tungsten, for example.

In addition to TiN, other suitable materials contemplated as barrier layer 26 include other metal nitrides, including TaN, CoN, an TuN; and other materials that will bond well with dielectric layer 14 and provide conductivity. (Conductivity is not important if the barrier layer is not deposited on bottom 20 or is cleaned off bottom 20 before metallization.)

For contact holes having a $W_b$ of about 0.3 microns and a D of about 0.17 microns, the contact hole being formed in silicon oxide over silicon, a suitable thickness for a TiN barrier 26 is believed to be about 150 angstroms of TiN deposited by CVD process. CVD TiN is preferred because it conforms particularly well to silicon and its oxides. This means that sidewalls 18 and bottom 20 of contact hole 12 have about the same thickness of material 26 as that on the wafer surface 28. The process for deposition of CVD TiN is well known in the art.

After deposition of barrier layer 26, an anneal step 118, according to known or available techniques, may optionally be performed. It is usually carried out under $N_2$ gas or an inert gas. The anneal step helps to drive out any moisture in barrier layer 26 and to harden the barrier layer and other layered materials to improve the integrity of the layers.

Figure 4:
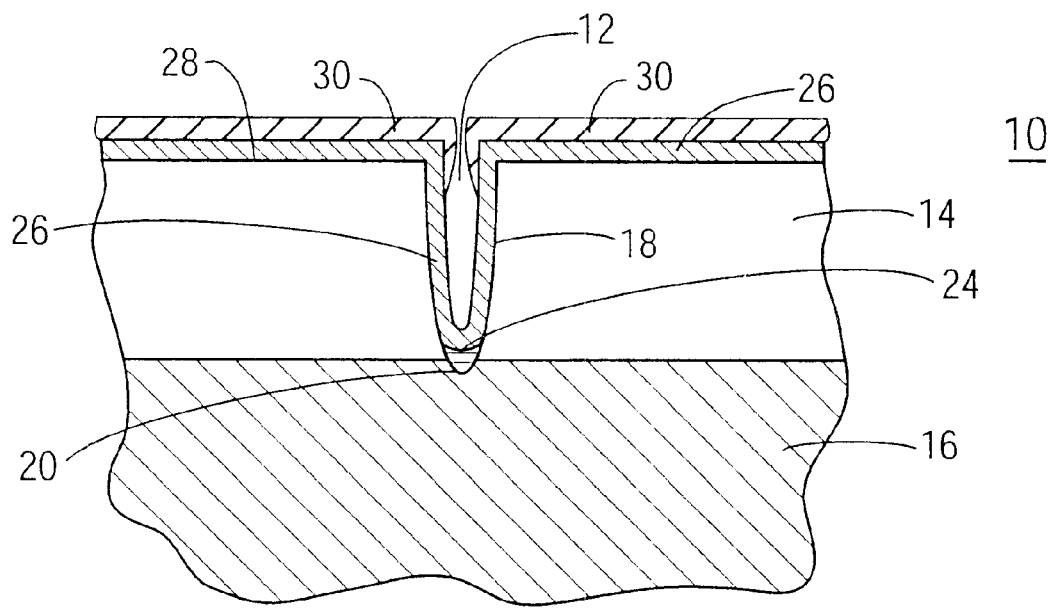
FIG. 4 is the same view of the contact hole of FIG. 3, now showing a second layer of protective material deposited over portions of the material shown in FIG. 3, according to the present invention.

After TiN or other material is deposited on the wafer surface 28 and in contact hole 12 to provide a barrier layer 26, a protective layer 30 is provided. In step 120, the protective layer 30 is selectively deposited over at least the structures that need to be protected during etching of contaminants 24 in subsequent step 124. To protect the CDs of contact hole 12, step 120 deposits a layer 30 of material at the top surface 28 of the wafer and around the upper portions of contact hole 12, as indicated in FIG. 4. The protective layer 30 adds thickness and thereby more resistance to etchant used in step 122. Instead of, or in addition to, protecting underlying structure by being a thickened layer for etchant to work through, the protective layer 30 could be a material that protects by having a lower etch rate than contaminant material 24 when subjected to the same etchant. By either approach, the CDs of contact hole 12 are less vulnerable to change during subsequent steps using etchants to remove contaminant material 24 at bottom 20.

Persons skilled in the art will understand that there may be situations where the step of forming barrier layer 26 is unnecessary. That is, the protective layer 30 may be directly deposited over the structures to be protected without a barrier layer 26 interposed between the protective layer 30 and the dielectric layer 14. In such situations, the protective layer 30 may also serve one or more of the functions of barrier layer 26.

Relative to bottom 20, a formation of protective material 30 can be formed on the wafer surface 28 around the opening of contact hole 12 by any known or available method. A preferred method by is a physical vapor deposition (PVD) process. In contrast to chemical vapor deposition, PVD conditions may be controlled to deposit more material at top surfaces 28 and around the top opening of contact hole 12 relative to the amounts deposited on sidewalls 18 and bottom 20. FIG. 4 illustrates that little to no material has been deposited onto sidewalls 18 and bottom 20 of contact hole 12.

Preferably, protective layer 30 may be selected from the same materials used for barrier layer 26, examples of which are listed above. TiN may be deposited by PVD over an initial barrier layer 26 of TiN or other compatible barrier layer material. It should be noted that this invention contemplates that barrier 26 or protective layer 30 material may be formed in a single layering step or multiple layering steps.

In one possible embodiment of the invention, a contact hole for a DRAM chip has about a diameter of about 0.3 micron at the top opening. It has a depth of about 2 microns. It has a bottom diameter of about 0.17 diameters. The contact hole is etched in a silicon dioxide dielectric layer 14 over a silicon-based conductive layer 16. Suitable thickness of a CVD barrier layer of TiN is about 150 angstroms. PVD TiN is deposited to about 250 angstroms over the CVD TiN at the top surface of the dielectric layer around the opening of contact hole 12.

After protective layer 30 is in place to protect the CDs of underlying structure, the wafer may now be etched in step 122. The etch process should selectively etch the bottom of contact hole 12. The purpose of the etch is to expose any contaminant material 24 from any underlying barrier layer 26 and/or protective layer 30. The contaminant material 24 must be sufficiently exposed so that it may be acted upon by etchants in subsequent etch step 124. Because of their good surface selectivity, dry etch techniques are preferably used in step 122—dry etch techniques are anisotropic, acting on surfaces that are relatively perpendicular to the flow of ions. Accordingly, a dry etch may selectively etch material at bottom 20 with relatively little or no etching of the sidewalls 18 or barrier or protective layer over the sidewalls. The dry etch may be based on various conventional reactants. Fluorine or chlorine based reactants are preferred. Suitable fluorine reactants for etching TiN include $CF_4$, $CHF_3$, or $C_4F_8$ in combination with Argon or other gas used known for use in dry etch methods. The dry etch is typically carried out under medium to high vacuum.

During the dry etch, protective layer 30 protects CDs at the top of the contact hole 12. A dry etch would generally not be used to remove the exposed contaminants because the underlying conductive layer is vulnerable to damage if over exposed to reactants used in dry etch techniques.

Figure 5A:
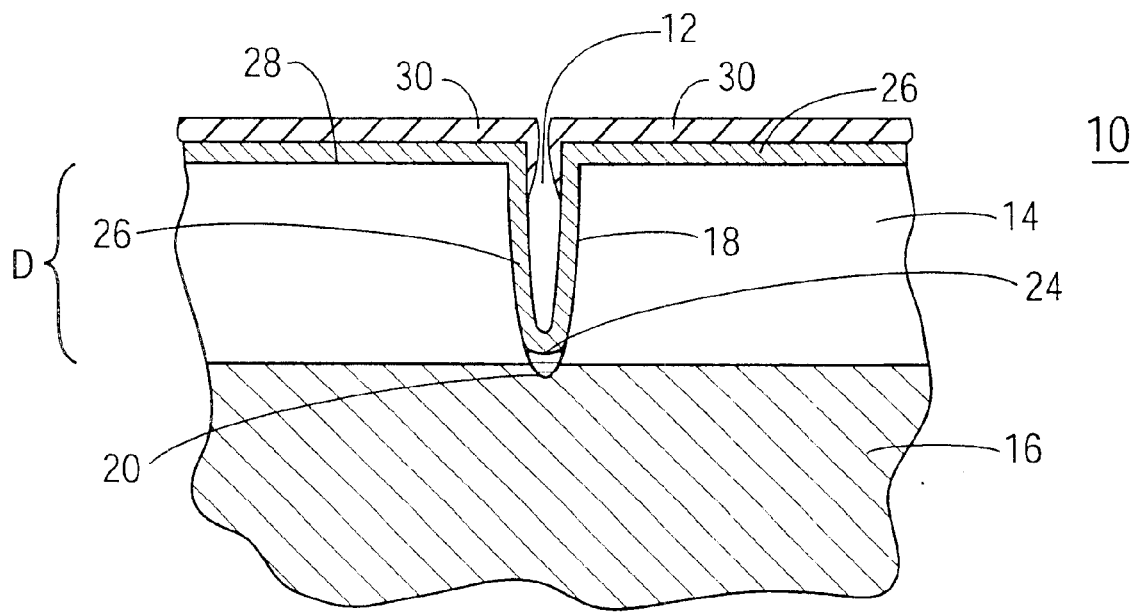
FIG. 5A is the same view of the contact hole of FIG. 4, now showing the contact hole after a selective etch to remove certain material at the bottom of the contact hole, according to the present invention.
Figure 5B:
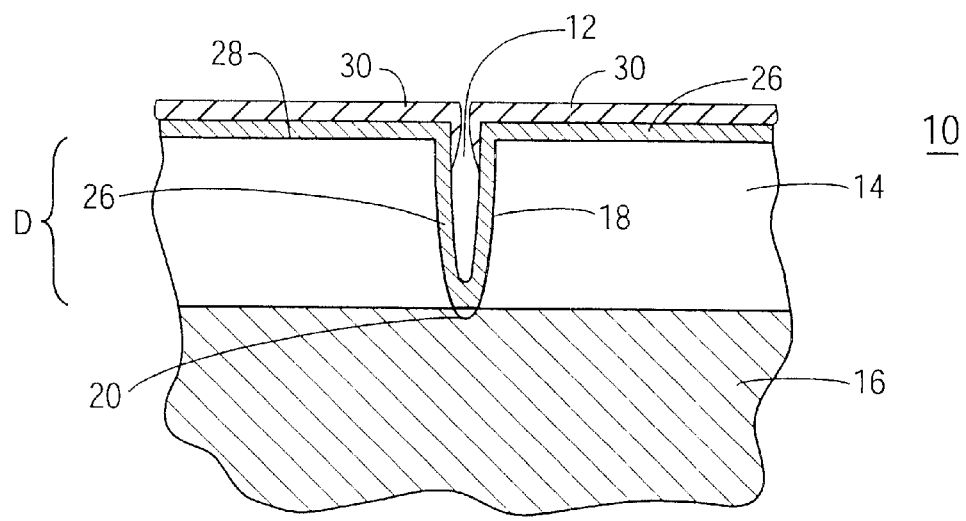
FIG. 5B is the same view of the contact hole of FIG. 5A, now showing the contact hole after a clean and/or etch to remove certain material at the bottom of the contact hole, according to the present invention.

In the embodiment illustrated in FIG. 5, a portion of layer 26 at bottom 20 is removed by the etch step 122. If any additional layers are over contaminant material 24, they too are removed to expose or to etch through contaminant material 24.

After any contaminant 24 is exposed in step 122, the wafer may then be cleaned and/or etched in step 124 to remove any contaminant 24. Known techniques may be used in this etch step. Suitable cleaning techniques include HF-DI based solutions with or without TMAH; phosphoric acid ($H_3PO_4$,) and ammonium fluoride ($NH_4F$) based solutions, as well as other known etching and cleaning solutions. One example of a suitable solution contains about 40 wt. % $NH_4F$, about 1.0–1.3 wt. % phosphoric acid ($H_3PO_4$,), and deionized water as the remainder. Typically, these solutions are used at about room temperature to about 60° C.

Using typical wet cleaning or etching techniques, the amount of time needed to etch bottom 20 clean is typically about sixty seconds, but contact hole CDs are adversely affected after about thirty seconds. By providing protective layer 26 and/or barrier layer 30 over bottom 20, an etch using such wet etch techniques may be as long as necessary to remove contaminant 24. The CDs of the contact hole 12 are protected through clean or etch step 124 because protective layer 30 is deposited around the opening of contact hole 12 (or at other desired locations). Following clean or etch step 124, an inspection step may be optionally performed to confirm CDs in the contact hole 12 have been maintained.

The device 10 now may be subject to metallization process steps 125–127 to form conductive plugs, metal lines, and other conductive structures in the wafer. In step 125, a suitable metal, such as titanium, tungsten, or cobalt is deposited over the cleaned conductive surface 16 at bottom 20 of contact hole 12. This forms a silicide that acts as a more conductive contact layer to the material for plug 32. In step 126, a barrier layer 29 may be redeposited onto the bottom 20 of contact hole 20. For the same reasons given above relative to barrier layer 26, a preferred material for barrier layer 29 is TiN. The barrier may be interposed between plug 32 and conductive substrate 16 to prevent the formation of eutectic alloys. The barrier layers 26, 29, plugs 32, metal lines 34, protective layers, and other conductive structures may consist of or be based on Al, Au, Cu, Mo, Pt, Ta, Ti, W, and polysilicon (preferably doped with boron, phosphorous, or arsenic), and suicides or polycides of the foregoing, and/or alloys of two or more of the foregoing. The selection and application of suitable materials for particular situations is well within the skill of persons skilled in the art.

In small contact holes having high aspect ratios, refractory metals such as Ti, W, Ta, Mo are preferred for use in forming plugs and other conductive structures. Refractory metals reduce contact resistance, which is influenced by the resistivity, length, thickness, and total contact resistance of all metal wafer interconnects. Generally, refractory metals may be deposited in contact holes, vias, and similar structures using conventional CVD techniques.

Figure 6:
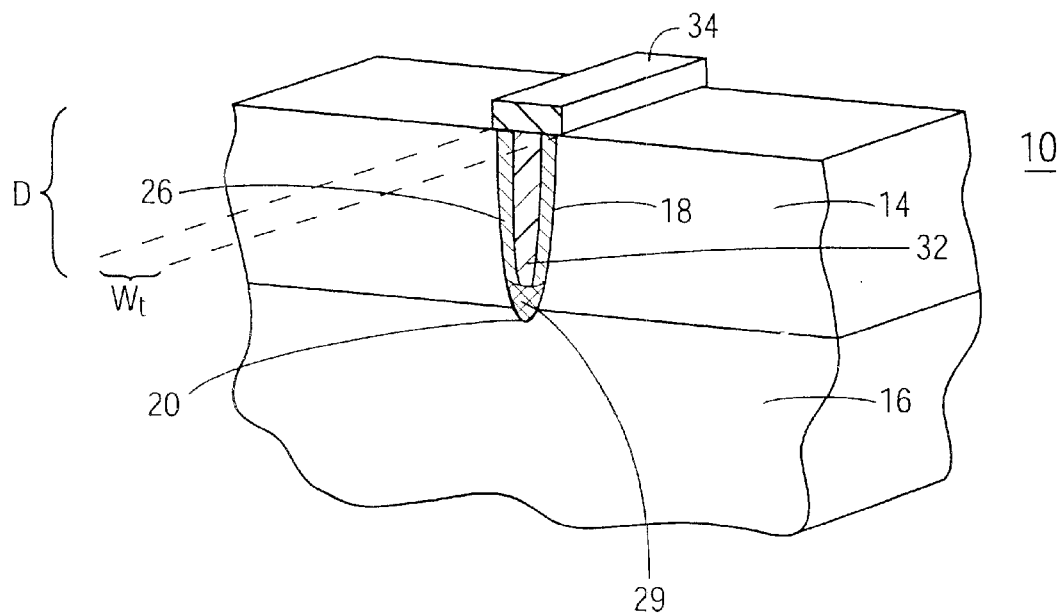
FIG. 6 is the same view of the contact hole of FIG. 5, now showing the contact hole after further processing and filling of the hole with conductive material to form a plug and a metal line connected thereto, according to the present invention.

In step 127, conductive material 22 is deposited in one or more steps to form plug 32 and metal line 34. Referring to FIG. 6, a conductive material 22 may be deposited onto the surface of dielectric layer 14 and into contact hole 18 to form conductive plug 32 and metal line 34. The metallization to form the plugs and metal lines may be carried out in a single step or in multiple steps according to well known techniques in the art.

While the foregoing principles of the present invention are described generally in terms of contact holes, they could be readily applied to form other structures involving small, high aspect ratio holes. For example, the principles could be used to form vias. Vias are passages that are etched in a dielectric layer and then filled with a conductive material. The conductive fill provides connections between different levels of metal lines on a chip. A via may be filled with metals such as tungsten, aluminum, or copper, as well as other conductive material. Since vias can be quite small, with high aspect ratios, the principles applicable to cleaning contacts of contaminants can advantageously be used to clean vias of such contaminants. The cleaning will help preserve CDs in the vias. For another example, DRAM capacitor containers are cut into an oxide down to silicon substrate or a polysilicon plug. The holes for such container may also have contaminants after formation. Therefore, the present invention may be used to clear contaminants from the holes for the containers. Accordingly, as used herein the terms "contact hole" and "plug" generally may refer to different kinds of holes formed on a work object and the conductive structures filling or lining such holes.

What is claimed:

1. A method of preparing a contact hole to receive a conductive plug comprising:

providing a work object having a conductive layer adjacent a dielectric layer, the dielectric layer having a top surface opposite the conductive layer in which at least one opening is formed to provide a contact hole having a sidewall surface extending downwardly from the top surface and having a bottom surface, the contact hole being formed to receive a conductive plug material; and depositing a layer of protective material on at least the top surface of the dielectric layer and extending from the top surface to a portion of the sidewall of the contact hole around the at least one opening to substantially maintain the critical dimensions of the contact hole during an etch process to remove contaminant material disposed over the conductive layer at the bottom of the contact hole.

2. The method of claim 1 further comprising depositing a layer of barrier material over the top surface of the dielectric layer and the sidewall and bottom surfaces of the contact hole before deposition of the protective material, and etching the barrier layer at the bottom of the contact hole to expose contaminant material, while retaining protective material on the top surface around the opening and the sidewall surface of the contact hole following the etch of the barrier layer.

3. The method of claim 2 wherein a dry etch technique is used to etch the barrier layer at the bottom of the contact hole and a wet etch technique is used to etch contaminant material exposed following the dry etch.

4. The method of claim 2 wherein the layer of barrier material comprises a refractory metal based compound extending from the top surface of the dielectric layer to the bottom of the contact hole; and the layer of protective material comprises a refractory metal based compound extending from the opening of the contact hole to a selected depth into the contact hole.

5. The method of claim 1 wherein the conductive layer comprises a silicon based material and the dielectric layer comprises a silicon oxide based material.

6. The method of claim 4 wherein the conductive layer comprises a silicon based material and the dielectric layer comprises a silicon oxide based material.

7. The method of claim 2 wherein the layer of protective material is deposited by PVD.

8. The method of claim 7 wherein the layer of barrier material is deposited by CVD.

9. The method of claim 1 wherein the layer of protective material comprises TiN.

10. The method of claim 6 wherein the refractory based compound for at least one of the barrier layer and protective layer comprises TiN.

11. The method of claim 4 wherein the layer of barrier material is deposited by a CVD process and the layer of protective material is deposited by a PVD process.

12. The method of claim 8 wherein the layer of barrier material is TiN deposited by a CVD process and the layer of protective layer is TiN deposited by a PVD process.

13. The method of claim 1 wherein the opening of the contact hole at the top surface of the dielectric layer has a width of about 2 microns or less.

14. The method of claim 4 wherein the opening of the contact hole at the top surface of the dielectric layer has a width of about 2 microns or less.

15. The method of claim 13 wherein the aspect ratio of the contact hole is about 3:1 or more.

16. The method of claim 14 wherein the aspect ratio of the contact hole is about 3:1 or more.

17. The method of claim 4 further comprising depositing a layer of refractory metal on the bottom of the contact hole subsequent to a wet etch.

18. The method of claim 1 wherein the contact hole comprises a container for a capacitor.

19. The method of claim 1 wherein the material for the protective layer disposed around the opening of the contact hole is introduced to the opening from a source external the contact hole while the material is being deposited.

20. A method of forming a conductive plug in a contact hole comprising:
providing a work object having a conductive layer adjacent a dielectric layer, the dielectric layer having a top surface opposite the conductive layer in which at least one opening is formed to provide a contact hole having a sidewall surface extending downwardly from the top surface and having a bottom surface defined by the conductive layer, the contact hole being formed to receive a conductive plug material; and
depositing a layer of protective material on at least the top surface of the dielectric layer and extending from the top surface to a portion of the sidewall of the hole around the at least one opening to substantially maintain the CDs of the opening of the contact hole during etching of the contact hole to remove contaminant material disposed over the conductive layer at the bottom of the contact hole;
etching the protective material at the bottom of the contact hole to expose contaminant material while retaining protective material around the opening of the contact hole; and
filling the contact hole with a conductive material to form a plug.

21. The method of claim 20 wherein the conductive layer is silicon based and the dielectric layer is a silicon oxide.

22. The method of claim 21 further comprising depositing a layer of barrier material over the top surface of the dielectric layer and the sidewall and bottom surfaces of the contact hole before deposition of the protective material, and etching the barrier layer at the bottom of the contact hole to expose contaminant material, while retaining protective material on the top surface around the opening and the sidewall surface of the contact hole following the etch of the barrier layer.

23. The method of claim 22 further wherein a dry etch technique is used to etch the barrier layer at the bottom of the contact hole and a wet etch technique is used to etch contaminant material exposed following the dry etch.

24. The method of claim 23 wherein the layer of barrier material comprises a refractory metal based compound extending from the top surface of the dielectric layer to the bottom of the contact hole; and the layer of protective material comprises a refractory metal based compound extending from the opening of the contact hole to a selected depth into the contact hole.

25. The method of claim 22 wherein the layer of protective material is deposited by PVD.

26. The method of claim 25 wherein the layer of barrier material is deposited by CVD.

27. The method of claim 25 wherein the layer of protective material comprises TiN.

28. The method of claim 24 wherein the refractory based compound for at least one of the barrier layer and protective layer comprises TiN.

29. The method of claim 24 wherein the first layer of barrier material is deposited by a CVD process and the second layer of protective material is deposited by a PVD process.

30. The method of claim 24 wherein the first layer of barrier material is TiN deposited by a CVD process and the second layer of protective material is TiN deposited by a PVD process.

31. The method of claim 22 wherein the opening of the contact hole at the surface of the dielectric layer has a width of about 2 microns or less.

32. The method of claim 29 wherein the opening of the contact hole at the surface of the dielectric layer has a width of about 2 microns or less.

33. The method of claim 31 wherein the aspect ratio of the contact hole is about 3:1 or more.

34. The method of claim 32 wherein the aspect ratio of the contact hole is about 3:1 or more.

35. The method of claim 23 further comprising depositing a layer of refractory metal on the bottom of the contact hole subsequent to the wet etch.

36. The method of claim 20 wherein the conductive plug comprises tungsten.

37. The method of claim 20 wherein the conductive plug material comprises Al, Au, Cu, or Ag.

38. The method of claim 21 further comprising depositing a metal over the conductive layer before depositing the material for the conductive plug.

39. The method of claim 38 further comprising depositing a barrier layer over the deposited metal before depositing the material for the conductive plug.

40. The method of claim 38 herein the deposited metal comprises Ti.

41. The method of claim 39 wherein the barrier metal comprises TiN.

42. The method of claim 41 wherein the conductive plug comprises tungsten.

43. The method of claim 20 wherein the contact hole comprises a via.

44. The method of forming a conductive plug in a contact hole comprising:
   providing a wafer having a conductive layer comprising silicon adjacent a dielectric layer comprising silicon oxide, the dielectric layer having a top surface opposite the conductive layer in which at least one opening is formed to provide a contact hole having a sidewall surface extending downwardly from the top surface and having a bottom surface defined by the conductive layer, a contaminant material being disposed over at least a portion of the conductive layer defining the bottom of the contact hole;
   depositing a layer of a barrier material on the wafer, the barrier layer having a substantially uniform thickness from the top surface of the dielectric layer to the bottom of the contact hole, and depositing a layer of a protective material on at least the top surface of the dielectric layer and extending from the top surface to a portion of the sidewall of the contact hole around the at least one opening of the contact hole;
   etching the barrier material at the bottom of the contact hole to expose the contaminant material while retaining protective material around the opening of the contact hole;
   etching the contact hole to remove contaminant material disposed over the conductive layer at the bottom of the contact hole; and
   filling the contact hole with a conductive material to form a plug.

45. The method of claim 44 wherein the opening of the contact hole at the top surface of the dielectric layer has a width of about 2 microns or less.

46. The method of claim 45 wherein the aspect ratio of the contact hole is about 3:1 or more.

47. The method of claim 44 wherein the dry etch is used to expose protective material over the contaminant material.

48. The method of claim 47 wherein a wet etch is used to remove the contaminant material at the bottom of the contact hole.

49. The method of claim 46 wherein a dry etch is used to expose protective material over the contaminant material.

50. The method of claim 49 wherein a wet etch is used to remove the contaminant material at the bottom of the contact hole.

51. The method of claim 44 further comprising depositing a metal over the conductive layer prior to filling the contact hole with the conductive material to form the plug.

52. The method of claim 48 further comprising depositing a metal over the conductive layer prior to filling the contact hole with the conductive material to form the plug.

53. The method of claim 52 further comprising forming a barrier layer over the deposited metal.

54. The method of claim 52 wherein the metal comprises TiN.

55. The method of claim 53 wherein the barrier layer comprises TiN.

56. The method of claim 51 wherein the metal comprises TiN.

57. The method of claim 51 wherein a barrier layer is formed over the deposited metal.

58. A method of preparing a contact hole to receive a conductive plug comprising:
   providing a work object having a conductive layer adjacent a dielectric layer, and a contact hole disposed in the dielectric layer, the contact hole having surfaces that include sidewalls formed in the dielectric layer and a bottom defined by the conductive layer, the contact hole having an opening for receiving a conductive plug material;
   depositing a layer of protective material on at least a top surface of the contact hole and extending from the top surface to a portion of the sidewall of the contact hole around the opening of the contact hole, the source of protective layer material being provided from a source external the hole concurrently with the act of depositing the layer; and
   etching the bottom surface of the contact hole to remove at least some contaminant material disposed over the conductive layer at the bottom of the contact hole, the protective layer protecting the CD of the contact hole so that the CD is not altered beyond selected tolerances.

59. A method of preparing a contact hole to receive a conductive plug comprising:
   providing a work object having a conductive layer adjacent a dielectric layer, and a contact hole disposed in the dielectric layer, the contact hole having surfaces that include sidewalls formed in the dielectric layer and a bottom defined by the conductive layer, the contact hole having an opening for receiving a conductive plug material; and
   depositing a layer of protective material from a source outside the contact hole on at least a top surface of the contact hole and extending from the top surface to a portion of the sidewall of the contact hole around the opening of the contact hole to substantially protect the CDs of the contact hole opening during an etch of the contact hole to remove any contaminant material disposed over the conductive layer at the bottom of the contact hole.

60. The method of claim 59 wherein the opening of the contact hole at the top surface of the dielectric layer has a width of about 2 microns or less.

61. The method of claim 59 further comprising depositing a layer of refractory metal on the bottom of the contact hole subsequent to a wet etch.

62. The method of claim 59 wherein the contact hole comprises a container for a capacitor.

* * * * *